US009564428B1

(12) United States Patent
Basker et al.

(10) Patent No.: US 9,564,428 B1
(45) Date of Patent: Feb. 7, 2017

(54) FORMING METAL-INSULATOR-METAL CAPACITOR (71) Applicant: INTERNATIONAL BUSINESS MACHINES CORPORATION, Armonk, NY (US)

(72) Inventors: Veeraraghavan S. Basker, Schenectady, NY (US); Kangguo Cheng, Schenectady, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 14/970,227

(22) Filed: Dec. 15, 2015

(51) Int. Cl.
*H01L 27/07* (2006.01)
*H01L 29/66* (2006.01)
*H01L 29/78* (2006.01)
*H01L 49/02* (2006.01)
*H01L 21/8234* (2006.01)

(52) U.S. Cl.
CPC ... *H01L 27/0733* (2013.01); *H01L 21/823431* (2013.01); *H01L 28/60* (2013.01); *H01L 29/66545* (2013.01); *H01L 29/66553* (2013.01); *H01L 29/66795* (2013.01); *H01L 29/785* (2013.01)

(58) Field of Classification Search
CPC ............. H01L 27/0733; H01L 21/823431; H01L 29/66545; H01L 28/60; H01L 29/66795; H01L 29/66553; H01L 29/785
See application file for complete search history.

(56) References Cited

U.S. PATENT DOCUMENTS

| 7,041,552 | B2 | 5/2006 | Clevenger et al. |
| 7,276,751 | B2 | 10/2007 | Ho et al. |
| 7,750,388 | B2 | 7/2010 | Ho et al. |
| 8,557,666 | B2 * | 10/2013 | Wei .................... H01L 21/76224 257/E21.09 |
| 8,716,803 | B2 * | 5/2014 | Wang .................. H01L 27/1156 257/192 |
| 9,041,115 | B2 * | 5/2015 | Liaw ..................... G11C 11/412 257/369 |
| 9,041,153 | B2 | 5/2015 | Chen et al. |
| 9,093,285 | B2 * | 7/2015 | Hung ..................... H01L 21/28 |
| 2008/0173978 | A1 | 7/2008 | Tu |
| 2012/0175701 | A1 * | 7/2012 | Park .................... H01L 27/0886 257/334 |
| 2015/0108557 | A1 | 4/2015 | Ponoth et al. |

* cited by examiner

*Primary Examiner* — William Coleman
(74) *Attorney, Agent, or Firm* — Cantor Colburn LLP (57) ABSTRACT

A method for fabricating a semiconductor device comprises forming a first sacrificial gate stack on a substrate, depositing an insulator layer on the substrate, adjacent to the first sacrificial gate stack, removing the first sacrificial gate stack to define a first cavity, forming a first metal gate in the first cavity, and depositing a conductive metal over a portion of the substrate adjacent to the first metal gate such that the first metal gate and the conductive metal partially define a capacitor.

18 Claims, 12 Drawing Sheets

FORMING METAL-INSULATOR-METAL CAPACITOR

BACKGROUND

The present invention generally relates to semiconductor devices, and more specifically, to forming metal-insulator-metal capacitors.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions.

The FinFET is a type of MOSFET. The FinFET is a double-gate or multiple-gate MOSFET device that mitigates the effects of short channels and reduces drain-induced barrier lowering. The "fin" refers to the narrow channel between source and drain regions. A thin dielectric layer on either side of the fin separates the fin channel from the gate.

A metal-insulator-metal capacitor is a capacitor that has an insulator portion arranged between two metal portions. The two metal portions act as conductors of the capacitor.

As the scaling of semiconductor devices continues to decrease, the formation of transistors and capacitors in close proximity continues to become more difficult. There are various limitations with aligning photolithographic masks to perform etching processes that form transistors and capacitors. As the scale of the devices becomes smaller, aligning photolithographic masks becomes more difficult.

SUMMARY

According to an embodiment of the present invention, a method for fabricating a semiconductor device comprises forming a first sacrificial gate stack on a substrate, depositing an insulator layer on the substrate, adjacent to the first sacrificial gate stack, removing the first sacrificial gate stack to define a first cavity, forming a first metal gate in the first cavity, and depositing a conductive metal over a portion of the substrate adjacent to the first metal gate such that the first metal gate and the conductive metal partially define a capacitor.

According to another embodiment of the present invention, a method for fabricating a semiconductor device comprises forming a fin on a substrate, forming a first sacrificial gate stack over the fin, forming a second sacrificial gate stack on the substrate, and forming a third sacrificial gate stack on the substrate, forming a spacer along sidewalls of the first sacrificial gate stack, the second sacrificial gate stack, and the third sacrificial gate stack, forming source/drain regions on the fin, depositing an insulator layer over the source/drain region, on the substrate, and adjacent to the first sacrificial gate stack, the second sacrificial gate stack, and the third sacrificial gate stack, removing the first sacrificial gate stack, the second sacrificial gate stack, and the third sacrificial gate stack to define a first cavity, a second cavity, and a third cavity, depositing a high-k dielectric layer in the first cavity, the second cavity, and the third cavity, forming a first metal gate in the first cavity, a second metal gate in the second cavity, and a third metal gate in the third cavity, removing portions of the insulator layer to expose the source/drain region, portions of the substrate adjacent to the second metal gate, and the third metal gate, and depositing a conductive metal over the source/drain region, the portion of the substrate adjacent to the second metal gate and the portion of the substrate adjacent to the third metal gate such that the second metal gate, the third metal gate, and the conductive metal partially define a capacitor and the first metal gate partially defines a transistor device.

According to yet another embodiment of the present invention, a semiconductor device comprises a transistor device arranged on a substrate, the transistor device comprising a first metal gate stack arranged over a channel region, a source/drain region arranged adjacent to the metal gate stack, and a capacitor device arranged on the substrate, the capacitor device comprising a second metal gate stack arranged on the substrate, a spacer arranged along a sidewall of the second metal gate stack, and a first conductive contact arranged on the substrate adjacent to the spacer such that the spacer is disposed between the first conductive contact and the second metal gate stack.

DETAILED DESCRIPTION

As the scale of semiconductor devices continues to decrease, aligning photolithographic masks to pattern various devices becomes more challenging.

The methods and resultant devices described herein provide for the formation of metal-insulator-metal capacitive devices with field effect transistor (FET) devices using a process flow that reduces the occurrence of alignment issues that may have been associated with previous methods for forming metal-insulator-metal (MIM) and FET devices on a wafer.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
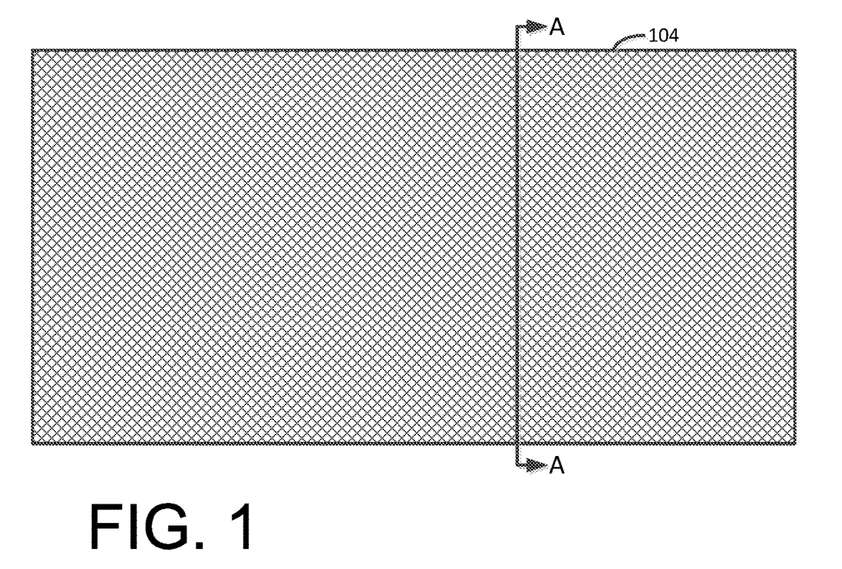
FIG. 1 illustrates a top view of a semiconductor on insulator (SOI) substrate.
Figure 2:
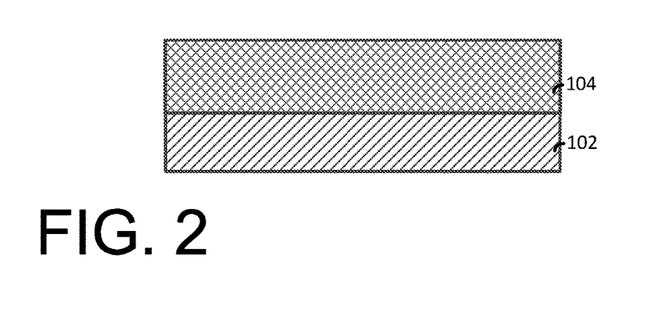
FIG. 2 illustrates a cutaway view of the SOI substrate along the line A-A of FIG. 1.

FIG. 1 illustrates a top view of a semiconductor on insulator (SOI) substrate 104. FIG. 2 illustrates a cutaway view of the SOI substrate along the line A-A of FIG. 1. The SOI substrate has an insulator layer 102 and a semiconductor layer 104. An SOI wafer includes a thin layer of a semiconducting material atop an insulating layer (i.e., an oxide layer) which is in turn disposed on a silicon substrate. The semiconducting material can include, but is not limited to, Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

Figure 3:
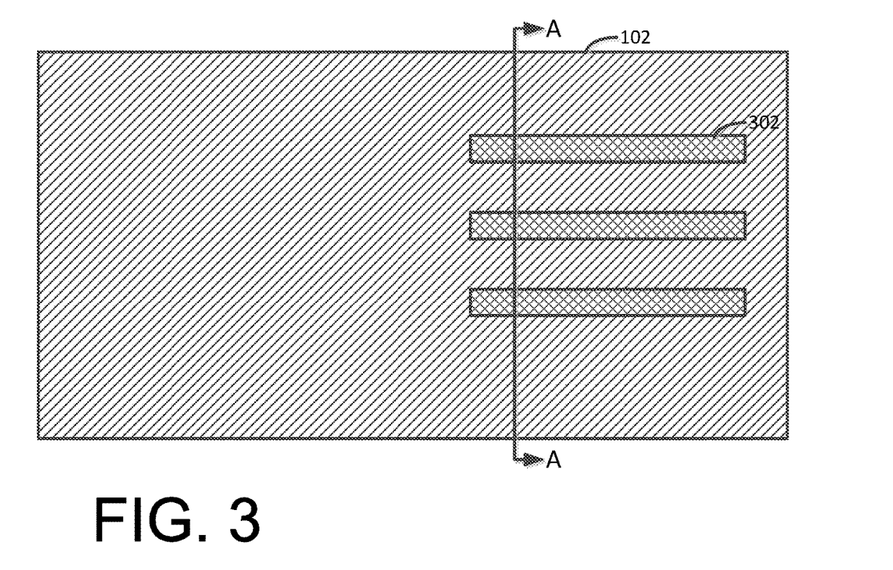
FIG. 3 illustrates a top view following the formation of fins.
Figure 4:
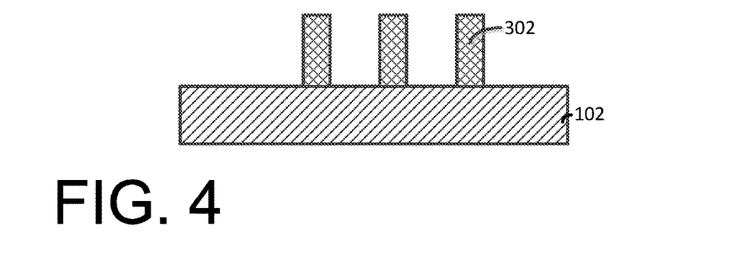
FIG. 4 illustrates a cutaway view of the fins along the line A-A of FIG. 3.

FIG. 3 illustrates a top view following the formation of fins 302. The fins 302 may be formed by, for example, a sidewall image transfer process, or a photolithographic patterning and etching process such as reactive ion etching (RIE). The fins are formed by removing portions of the semiconductor layer 104 (of FIG. 2) to expose portions of the insulator layer 102 and define the fins 302. FIG. 4 illustrates a cutaway view of the fins 302 along the line A-A of FIG. 3. Though the illustrated exemplary embodiment shows a SOI substrate, alternate embodiments may include a bulk wafer substrate. In embodiments with a bulk wafer, the fins 302 are formed on the bulk substrate. Trench isolation and junction isolation using an insulator layer (not shown) formed on the substrate to isolate the devices.

Figure 5:
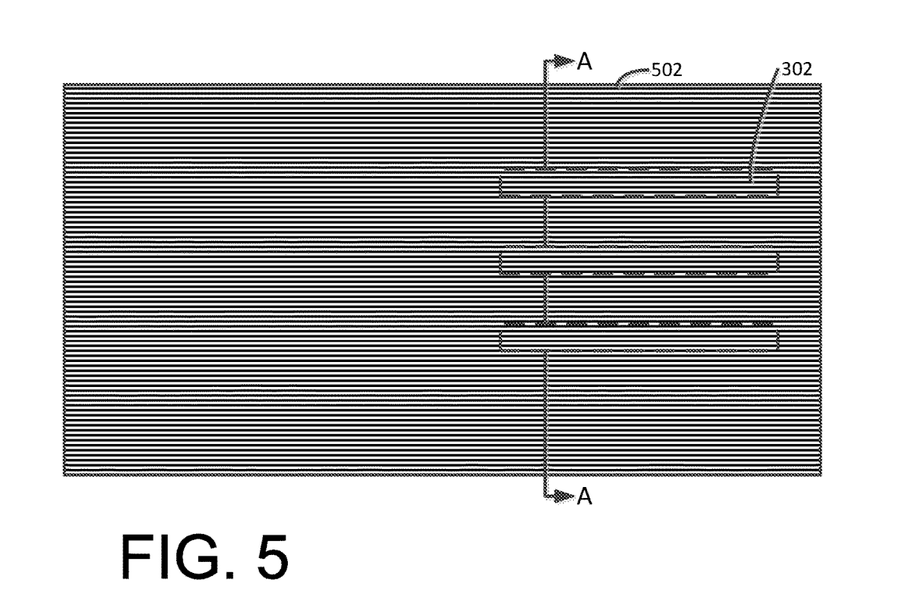
FIG. 5 illustrates a top view of the resultant structure following the deposition of a layer of sacrificial gate material (of FIG. 6) and a hardmask layer over the sacrificial gate material.
Figure 6:
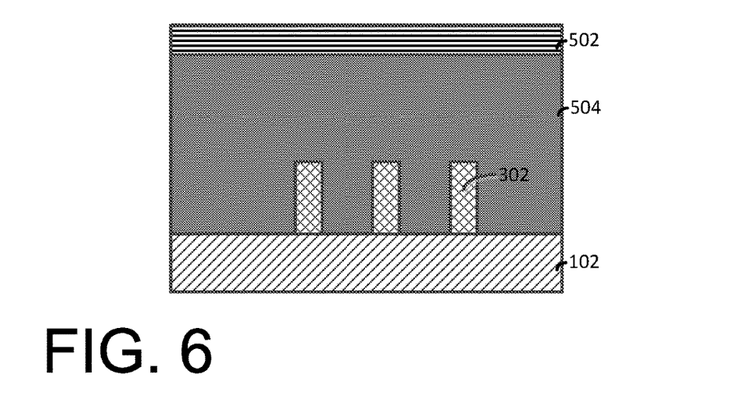
FIG. 6 illustrates a cutaway view along the line A-A of FIG. 5.

FIG. 5 illustrates a top view of the resultant structure following the deposition of a layer of sacrificial gate material 504 (of FIG. 6) and a hardmask layer 502 over the sacrificial gate material 504. FIG. 6 illustrates a cutaway view along the line A-A of FIG. 5. The sacrificial gate material 504 may include, for example, a polysilicon material. In some exemplary embodiments, a sacrificial dielectric layer (e.g., silicon oxide) is formed underneath the sacrificial polysilicon gate. The sacrificial dielectric facilitates subsequent polysilicon gate removal while protecting the underlying fins 203 (of FIG. 2). Non-limiting examples of suitable materials for the hard mask layer 502 include silicon oxide, silicon nitride, or any combination thereof. The thickness of the hard mask layer 502 is not intended to be limited.

Figure 7:
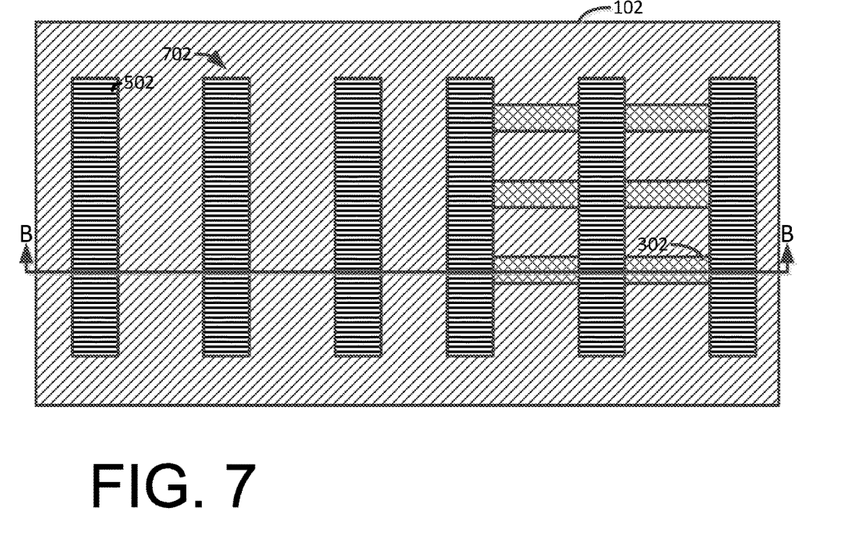
FIG. 7 illustrates a top view following the patterning and etching of sacrificial gate stacks.
Figure 8:
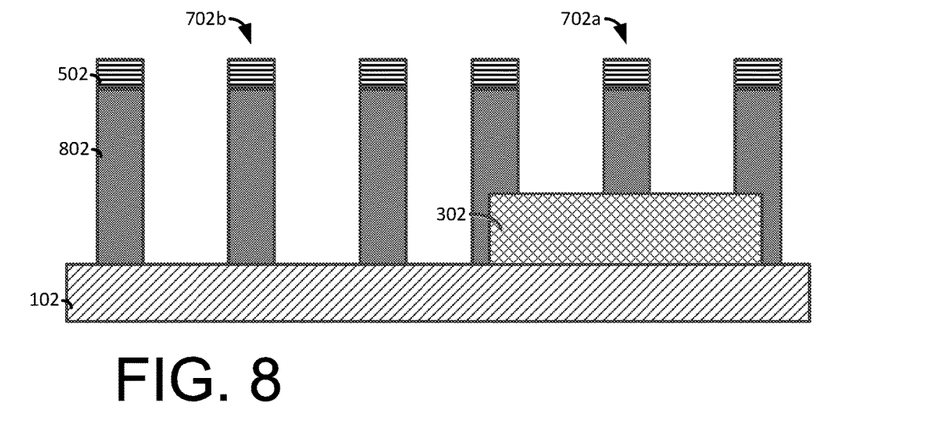
FIG. 8 illustrates a cutaway view along the line B-B of FIG. 7.

FIG. 7 illustrates a top view following the patterning and etching of sacrificial gate stacks 702. FIG. 8 illustrates a cutaway view along the line B-B of FIG. 7. The sacrificial gate stacks 702 are arranged over both the fins 302 and portions of the insulator layer 102 that do not include the fins. Thus, the sacrificial gate stacks 702 are arranged such that the sacrificial gate stacks 702a that are arranged over the fins 302 define channel regions of the fins 302, while other sacrificial gate stacks 702b are not arranged over the fins 702.

Figure 9:
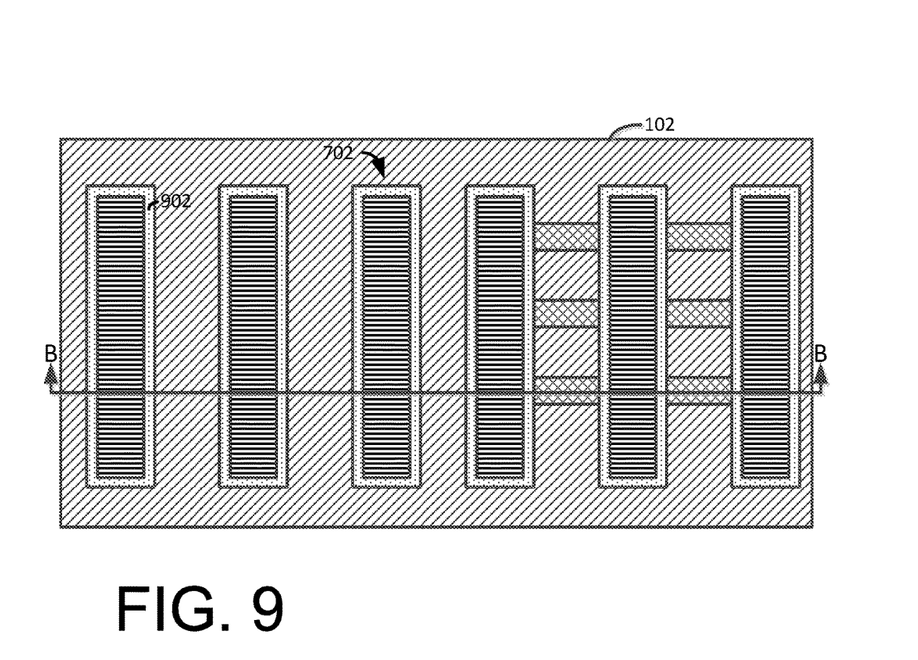
FIG. 9 illustrates a top view of the resultant structure following the formation of spacers along the sidewalls of the sacrificial gate stacks.
Figure 10:
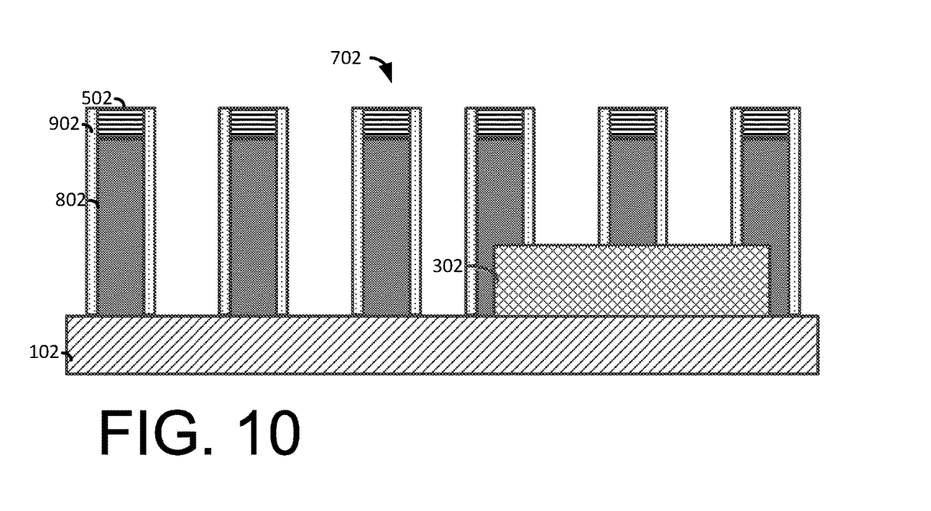
FIG. 10 illustrates a cutaway view along the line B-B of FIG. 9.

FIG. 9 illustrates a top view of the resultant structure following the formation of spacers 902 along the sidewalls of the sacrificial gate stacks 702. The low-k spacers 902 may contain Si, N, and at least one element selected from the group consisting of C and B. Additionally, the low-k spacers 902 may contain Si, N, B, and C. For example, the low-k spacer material 902 may include SiBN, SiCN, SiBCN, SiOCN, or any combination thereof. The spacers 902 are formed by depositing a layer of low-k spacer material and performing an etching process such as, for example, reactive ion etching to expose a portion of the hardmask layer 502 and portions of the fins 302 (as shown in FIG. 10).

Figure 11:
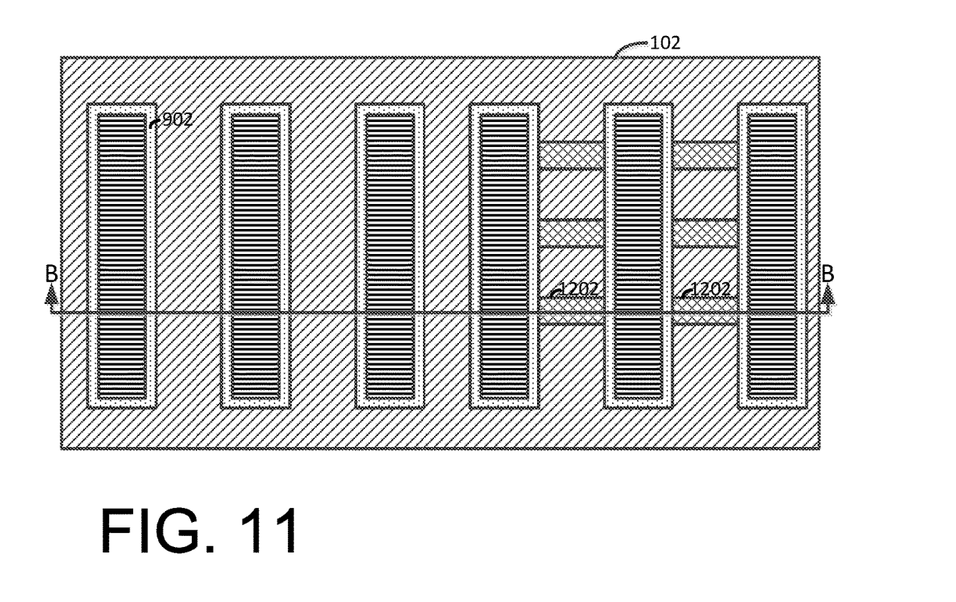
FIG. 11 illustrates a top view following the formation of source/drain regions.
Figure 12:
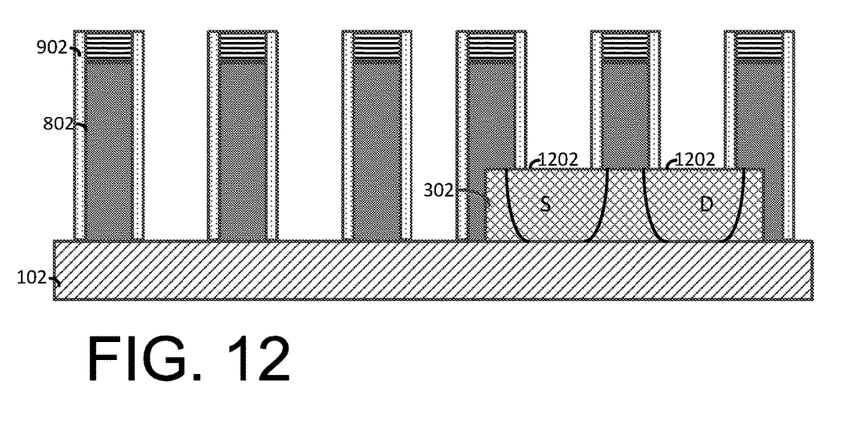
FIG. 12 illustrates a cutaway view along the line B-B of FIG. 11 showing the source/drain region.

FIG. 11 illustrates a top view following the formation of source/drain regions 1202. The source/drain regions may be formed by, for example, an ion implantation and annealing process that implants dopants in the exposed regions of the fins. In an alternate exemplary embodiment, the source/drain regions may be formed by, for example, an epitaxial growth process. An epitaxial growth process deposits a crystalline layer onto a crystalline substrate beneath. The underlying substrate acts as a seed crystal. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide. The silicon may be doped with an n-type dopant (e.g., phosphorus or arsenic) or a p-type dopant (e.g., boron or gallium), depending on the type of transistor during the epitaxial growth process. Alternatively, the epitaxial material may be doped using ion implantation following the epitaxial growth process. FIG. 12 illustrates a cutaway view along the line B-B of FIG. 11 showing the source/drain region 2102.

Figure 13:
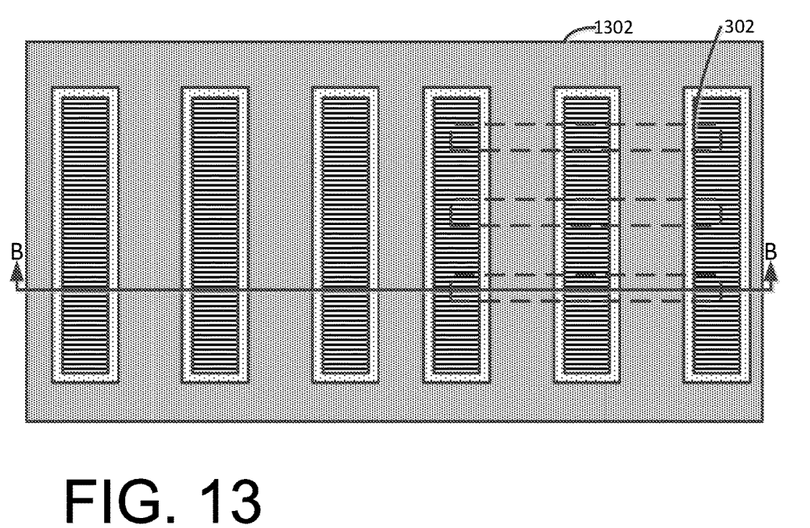
FIG. 13 illustrates a top view following the formation of an insulator layer over portions of the fins and the insulator layer.
Figure 14:
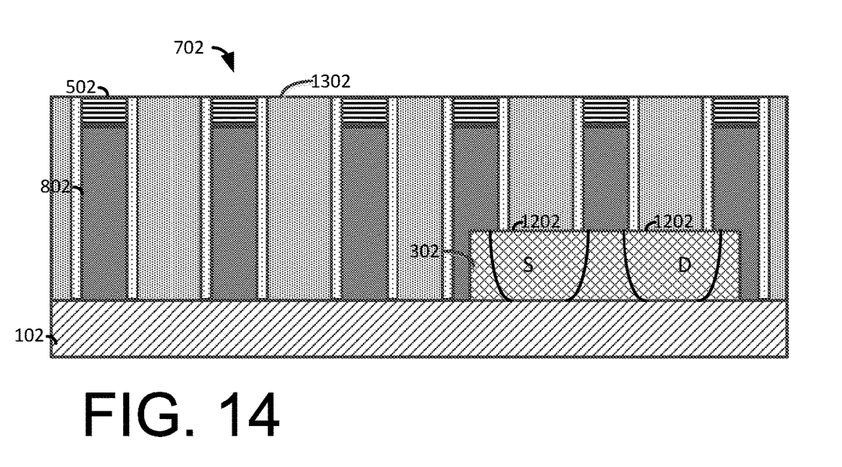
FIG. 14 illustrates a cutaway view along the line B-B of FIG. 13 showing the insulator layer.

FIG. 13 illustrates a top view following the formation of an insulator layer 1302 over portions of the fins 302 and the insulator layer 102. The insulator layer 1302 includes, for example, an oxide material. Non-limiting examples of suitable oxide materials include silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, or any combination thereof. Following the deposition of the insulator layer 1302 a planarization process such as, for example, chemical mechanical polishing (CMP) may be performed. FIG. 14 illustrates a cutaway view along the line B-B of FIG. 13 showing the insulator layer 1302.

Figure 15:
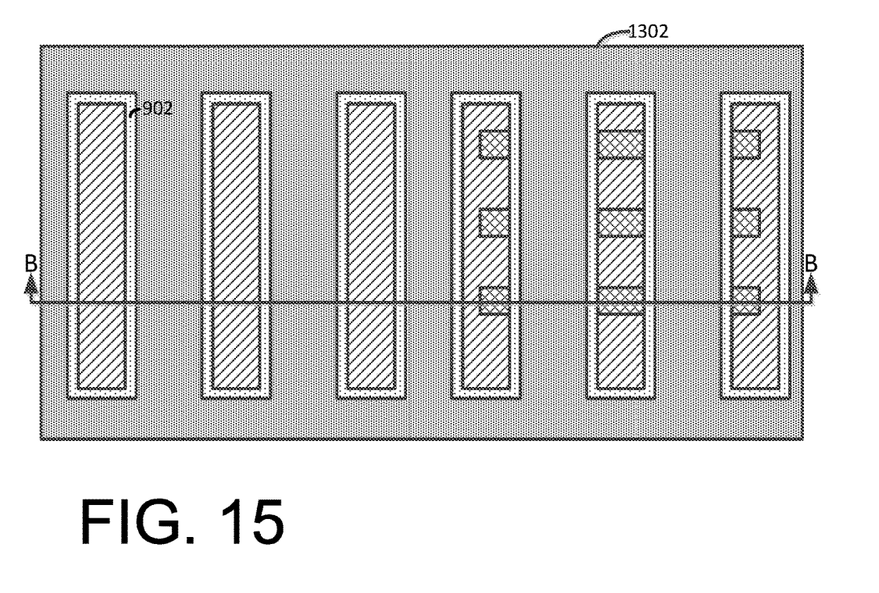
FIG. 15 illustrates a top view of the resultant structure following the removal of the sacrificial gate stacks by removing the hardmask layer and the sacrificial gate material.
Figure 16:
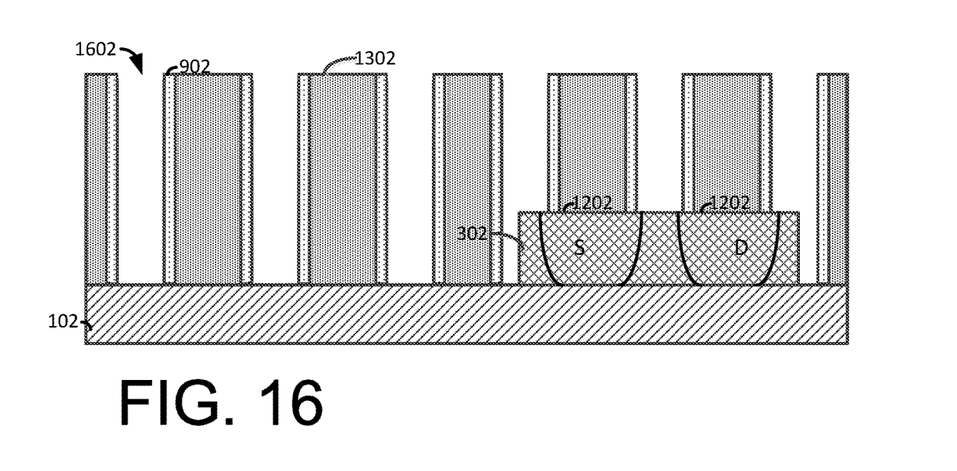
FIG. 16 illustrates a cutaway view along the line B-B of FIG. 15 showing the cavities.

FIG. 15 illustrates a top view of the resultant structure following the removal of the sacrificial gate stacks 702 by removing the hardmask layer 502 and the sacrificial gate material 802 using a suitable etching process. The removal of the sacrificial gate stacks forms cavities 1602 that are partially defined by the insulator layer 102 and the spacers 902. FIG. 16 illustrates a cutaway view along the line B-B of FIG. 15 showing the cavities 1602.

Figure 17:
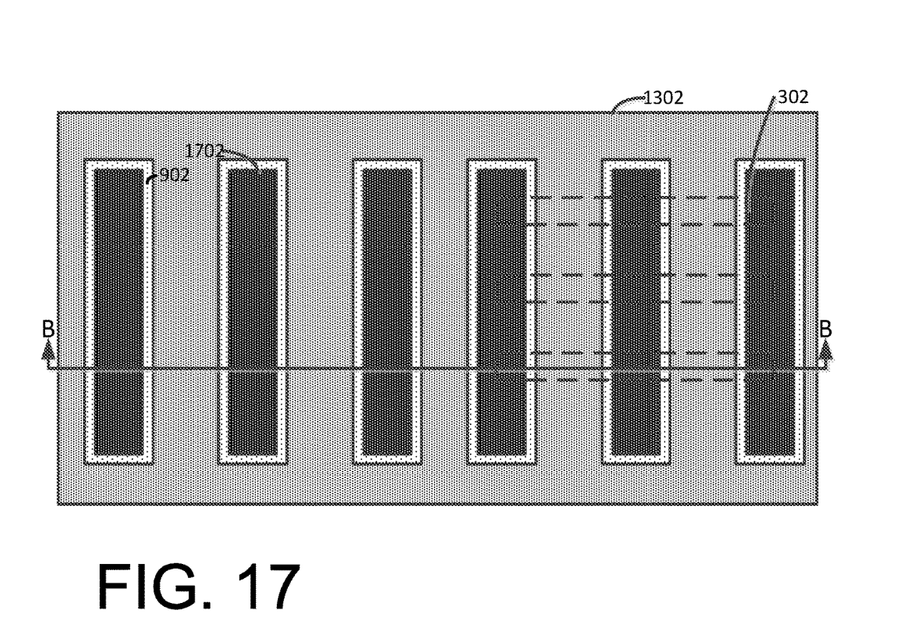
FIG. 17 illustrates a top view following the formation of a high-k dielectric layer in the cavities.

FIG. 17 illustrates a top view following the formation of a high-k dielectric layer in the cavities 1602. The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high-k dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

Figure 18:
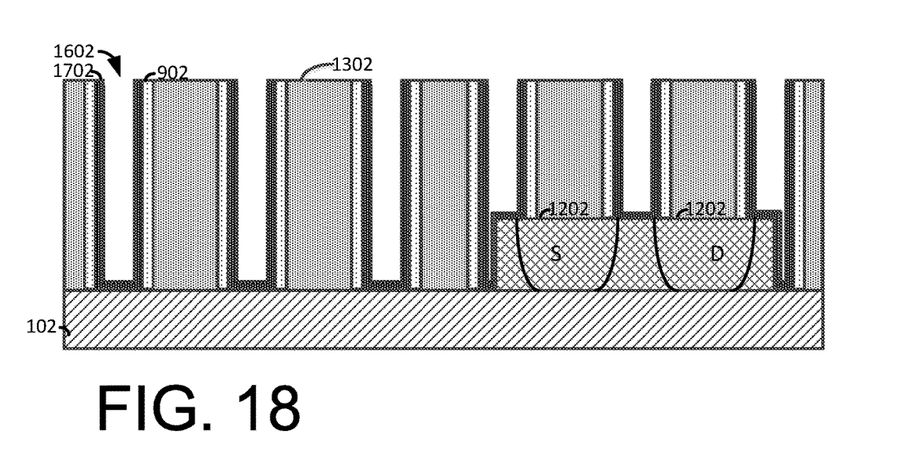
FIG. 18 illustrates a cutaway view along the line B-B of FIG. 17 of the high-k dielectric layer in the cavities.

FIG. 18 illustrates a cutaway view along the line B-B of FIG. 17 of the high-k dielectric layer 1702 in the cavities 1602.

Figure 19:
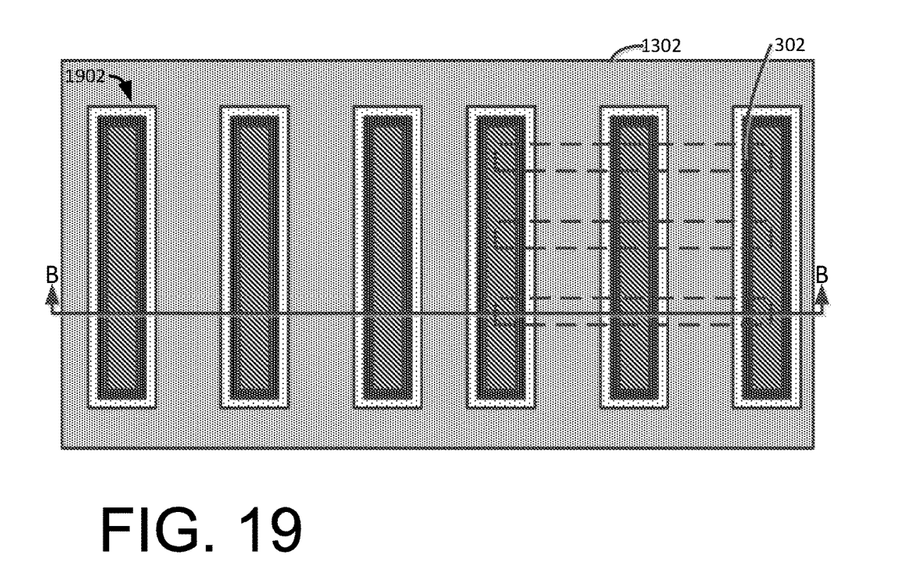
FIG. 19 illustrates a top view following the formation of replacement gate stacks.
Figure 20:
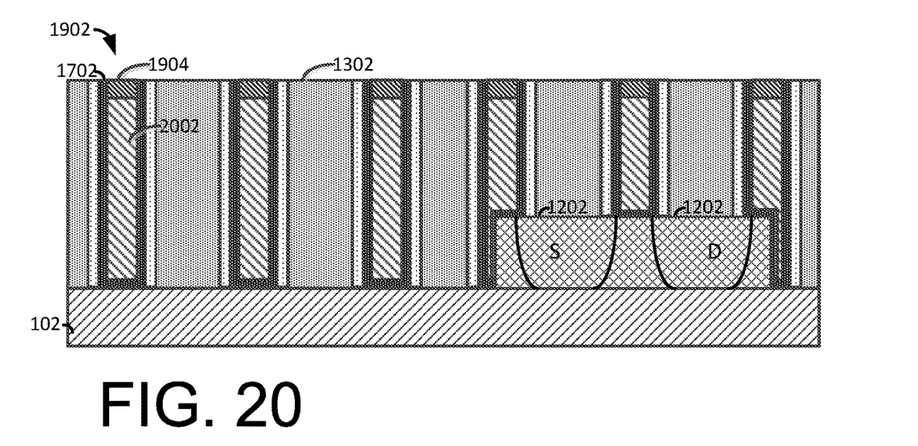
FIG. 20 illustrates a cutaway view along the line B-B of FIG. 19 of the replacement gate stacks.

FIG. 19 illustrates a top view following the formation of replacement gate stacks 1902. FIG. 20 illustrates a cutaway view along the line B-B of FIG. 19 of the replacement gate stacks 1902. The replacement gate stacks 1902 of the illustrated embodiment include a gate conductor 2002 and an optional insulator cap 1904. The gate conductor(s) 2002 may be disposed over the high-k dielectric material. The gate conductor may comprise a workfunction metal and a low resistance metal. The type of work function metal(s) depends on the type of transistor and may differ between an NFET and a PFET. Non-limiting examples of suitable gate conductors 2002 include p-type gate conductor materials and n-type gate conductor materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The high-k dielectric material(s) and gate conductor(s) to form the gate stacks. Non-limiting examples of low resistance metal include aluminum (Al), platinum (Pt), gold (Au), tungsten (W), titanium (Ti), or any combination thereof. Conductive metallic compounds can also be used in forming the metal gate. The conductive metal may be deposited by a suitable deposition process, for example, CVD, PECVD, PVD, plating, thermal or e-beam evaporation, and sputtering.

An insulator cap 1904 is deposited over the gate conductor. In one embodiment, the insulator cap 1904 is formed by recessing the gate conductor, depositing an insulator material, and planarizing the insulator material by chemical mechanical polishing. The insulator cap 1904 can be silicon oxide, silicon nitride, SiOCH, SiBCN, SiOCN, SiBN, SiCN, or any suitable combination of those materials. The insulator cap, if present, enables self-aligned contacts to source/drain without electrically shorting the source/rain contacts to the gate.

A planarization process, for example, chemical mechanical polishing (CMP), is performed to polish the surface of the conductive gate metal.

Figure 21:
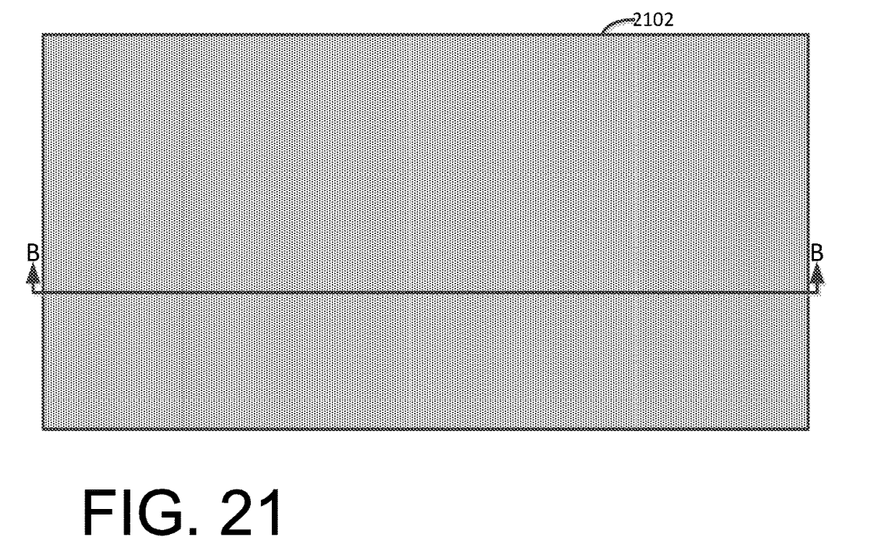
FIG. 21 illustrates a top view following the deposition of another insulator layer over the insulator layer and the replacement gate stacks.
Figure 22:
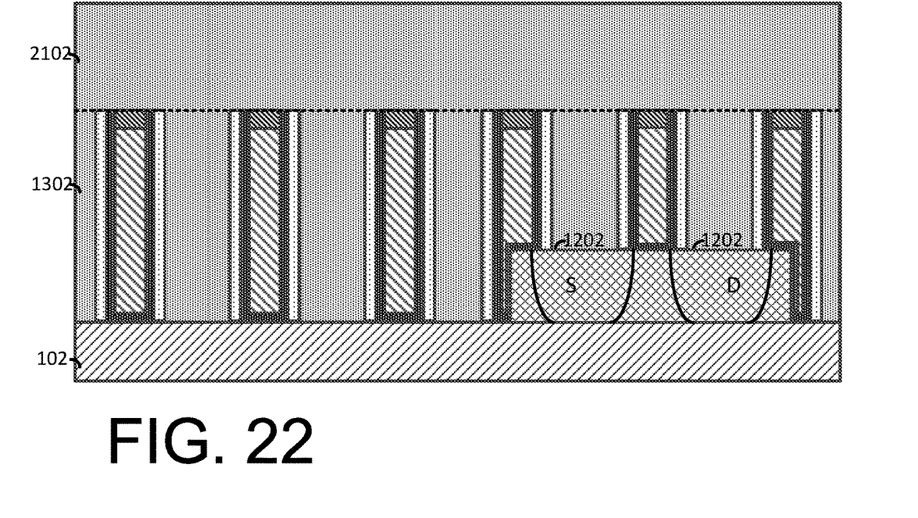
FIG. 22 illustrates a cutaway view along the line B-B of FIG. 21 showing the insulator layer.

FIG. 21 illustrates a top view following the deposition of another insulator layer 2102 over the insulator layer 1302 and the replacement gate stacks 1902. The insulator layer 2102 includes, for example, an oxide material. Non-limiting examples of suitable oxide materials include silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, or any combination thereof. Following the deposition of the insulator layer 2102 a planarization process such as, for example, chemical mechanical polishing (CMP) may be performed. FIG. 22 illustrates a cutaway view along the line B-B of FIG. 21 showing the insulator layer 2102.

Figure 23:
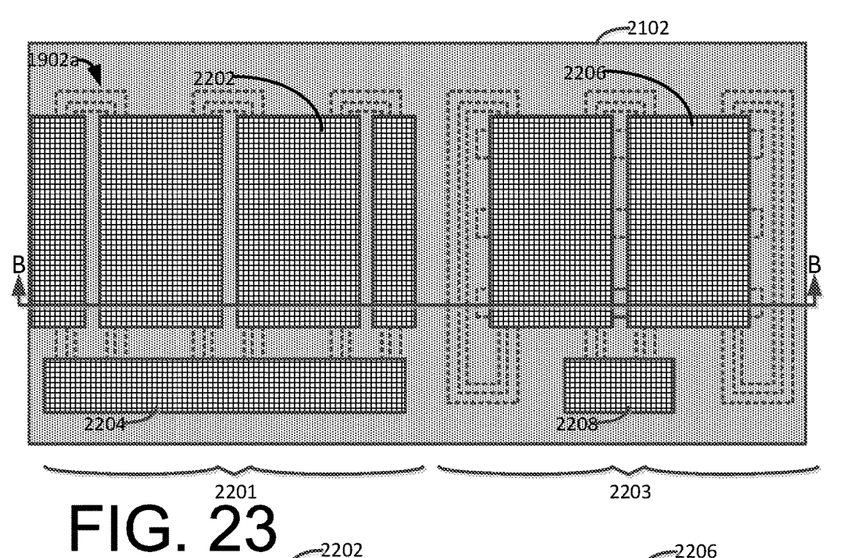
FIG. 23 illustrates a top view following the formation of conductive contacts.
Figure 24:
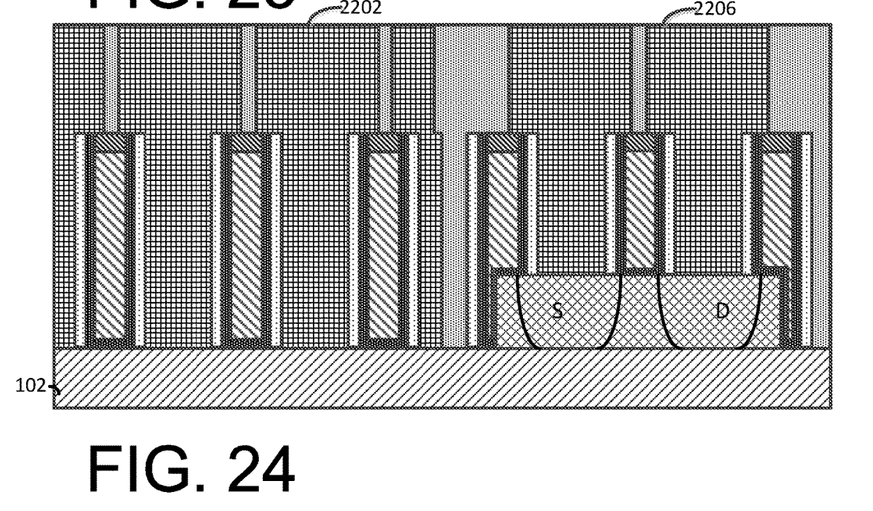
FIG. 24 illustrates a cutaway view along the line B-B of FIG. 23 showing the conductive contacts.

FIG. 23 illustrates a top view following the formation of conductive contacts 2202, 2206, 2204, and 2208. The conductive contacts 2202, 2206, 2204, and 2208 are formed by, for example, a photolithographic patterning and etching process that removes portions of the insulator layer 1302 and the insulator layer 2102. The etching process exposes the source/drain regions 1202 and portions of the insulator layer 102. Following the etching process a silicide (not shown) may be formed on the source/drain regions 1202. A liner layer (not shown) may be deposited over the silicide. A contact metal such as, for example, tungsten, aluminum, copper, silver, or gold is deposited and planarized using, for example, a spin on deposition process followed by a chemical mechanical polishing process. FIG. 24 illustrates a cutaway view along the line B-B of FIG. 23 showing the conductive contacts 2202 and 2206.

In operation, the conductive contacts 2202 and gate stacks 1902a form the plates of the capacitor while the spacers and high-k dielectric layer act as the dielectric material disposed between the plates. The conductive contact 2204 is connected to the gate stacks 1902a such that a metal-insulator-metal capacitor 2201 is formed. Adjacent to the capacitor 2201 a FET device 2203 is formed. As shown above, the capacitor 2201 and the FET device 2203 are formed in substantially the same process flow using substantially the same process flow steps. Whether a capacitor 2201 or a FET device 2203 is formed is determined by whether the gate stacks 1902 are formed over a fin 302, wherein the location of the fins 302 is determined by the lithographic pattern used to form the fins as discussed above in FIG. 3.

In this regard, the methods described herein provide for forming a metal-insulator-metal capacitor and a FET device on a wafer where the conductive contacts of the capacitor and the gate stacks that define the plates of the capacitor are self-aligned and formed with the conductive contacts and gate stacks of the FET device, which are also self-aligned.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a semiconductor device, the method comprising:
   forming a first sacrificial gate stack on a substrate;
   depositing an insulator layer on the substrate, adjacent to the first sacrificial gate stack;
   removing the first sacrificial gate stack to define a first cavity;
   forming a first metal gate in the first cavity; and
   depositing a conductive metal over a portion of the substrate adjacent to the first metal gate such that the first metal gate and the conductive metal partially define a capacitor.

2. The method of claim 1, further comprising forming a spacer along sidewalls of the first sacrificial gate stack.

3. The method of claim 1, further comprising depositing a second insulator layer after forming the first metal gate.

4. The method of claim 1, wherein the insulator layer includes an oxide material.

5. The method of claim 2, further comprising depositing a high-k dielectric layer in the first cavity prior to forming the first metal gate in the first cavity.

6. The method of claim 5, further comprising:
   forming a second sacrificial gate stack on the substrate;
   forming the spacer along sidewalls of the second sacrificial gate stack;
   removing the second sacrificial gate stack to form a second cavity;
   depositing the high-k dielectric layer in the second cavity;
   forming a second metal gate in the second cavity;
   removing a portion of the insulator layer to expose a portion of the substrate adjacent to the second metal gate;
   depositing the conductive metal over the portion of the substrate adjacent to the second metal gate.

7. The method of claim 6, further comprising forming a conductive contact that electrically connects the first metal gate to the second metal gate to form a capacitor.

8. The method of claim 3, wherein the first sacrificial gate stack includes a silicon material.

9. The method of claim 3, wherein the second insulator layer includes an oxide material.

10. A method for fabricating a semiconductor device, the method comprising:
    forming a fin on a substrate;
    forming a first sacrificial gate stack over the fin, forming a second sacrificial gate stack on the substrate, and forming a third sacrificial gate stack on the substrate;
    forming a spacer along sidewalls of the first sacrificial gate stack, the second sacrificial gate stack, and the third sacrificial gate stack;
    forming source/drain regions on the fin;
    depositing an insulator layer over the source/drain region, on the substrate, and adjacent to the first sacrificial gate stack, the second sacrificial gate stack, and the third sacrificial gate stack;
    removing the first sacrificial gate stack, the second sacrificial gate stack, and the third sacrificial gate stack to define a first cavity, a second cavity, and a third cavity;
    depositing a high-k dielectric layer in the first cavity, the second cavity, and the third cavity;
    forming a first metal gate in the first cavity, a second metal gate in the second cavity, and a third metal gate in the third cavity;
    removing portions of the insulator layer to expose the source/drain region, portions of the substrate adjacent to the second metal gate, and the third metal gate; and
    depositing a conductive metal over the source/drain region, the portion of the substrate adjacent to the second metal gate and the portion of the substrate adjacent to the third metal gate such that the second metal gate, the third metal gate, and the conductive metal partially define a capacitor and the first metal gate partially defines a transistor device.

11. The method of claim 10, wherein the first sacrificial gate stack, the second sacrificial gate stack, and the third sacrificial gate stack are arranged substantially in parallel.

12. The method of claim 10, wherein the spacer includes a nitride material.

13. The method of claim 10, wherein the spacer includes a dielectric material.

14. The method of claim 10, further comprising depositing a second insulator layer after forming the first metal gate and the second metal gate.

15. The method of claim 10, further comprising forming a conductive contact that electrically connects the second metal gate to the third metal gate to form a capacitor.

16. The method of claim 10, wherein the insulator layer includes an oxide material.

17. The method of claim 14, wherein removing portions of the insulator layer to expose the source/drain region and portions of the substrate adjacent to the second metal gate includes removing portions of the second insulator layer.

18. The method of claim 14, wherein the second insulator layer includes an oxide material.

\* \* \* \* \*